United States Patent
Kucharski et al.

(10) Patent No.: US 10,431,538 B2
(45) Date of Patent: Oct. 1, 2019

(54) TRANSISTOR PACKAGES

(71) Applicant: Hamilton Sundstrand Corporation, Charlotte, NC (US)

(72) Inventors: David M. Kucharski, Delavan, WI (US); John A. Dickey, Caledonia, IL (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 0 days.

(21) Appl. No.: 15/640,117

(22) Filed: Jun. 30, 2017

(65) Prior Publication Data
US 2019/0006273 A1    Jan. 3, 2019

(51) Int. Cl.
*H01L 23/50* (2006.01)
*H01L 23/057* (2006.01)
*H01L 23/498* (2006.01)

(52) U.S. Cl.
CPC ............ *H01L 23/50* (2013.01); *H01L 23/057* (2013.01); *H01L 23/49805* (2013.01)

(58) Field of Classification Search
CPC ......... H01L 23/49555; H01L 23/49562; H01L 2224/48; H01L 2224/4801; H01L 2224/4805; H01L 24/44; H01L 24/46; H01L 2224/30181; H01L 23/3157; H01L 23/50; H01L 23/057; H01L 23/4805; H01L 23/49551; H01L 23/3107; H01L 2224/49175; H01L 2224/05554; H01L 2224/05556; H01L 23/481; H01L 23/49541; H01L 23/49861; H01L 24/06; H01L 24/49

See application file for complete search history.

(56) References Cited

U.S. PATENT DOCUMENTS

| 7,052,938 | B2 | 5/2006 | Estacio et al. | |
| 7,812,464 | B2 | 10/2010 | Hirashima et al. | |
| 9,500,678 | B2 | 11/2016 | Williams | |
| 9,601,453 | B2 | 3/2017 | Hebert | |
| 2006/0138532 | A1* | 6/2006 | Okamoto | H01L 23/051 257/328 |
| 2008/0211082 | A1* | 9/2008 | Hirashima | H01L 21/561 257/692 |
| 2013/0020695 | A1* | 1/2013 | Na | H01L 23/49555 257/696 |
| 2013/0062788 | A1* | 3/2013 | Sakura | H01L 23/047 257/784 |
| 2014/0374801 | A1* | 12/2014 | Ikeda | H01L 23/492 257/195 |
| 2015/0287665 | A1* | 10/2015 | Hanada | H01L 25/115 257/691 |

* cited by examiner

*Primary Examiner* — Frederick B Hargrove
(74) *Attorney, Agent, or Firm* — Locke Lord LLP; Scott D. Wofsy; Alicia J. Carroll

(57) ABSTRACT

In accordance with another aspect, a power switch assembly includes a transistor package including a die case, a source bus tab extending from a first side of the die case, a drain bus tab extending from a second side of the die case, a first power bus rail operatively connected to the source bus tab of the transistor package and a second power bus rail operatively connected to the drain bus tab of the transistor package.

20 Claims, 4 Drawing Sheets

TRANSISTOR PACKAGES

BACKGROUND OF THE INVENTION

1. Field of the Invention

The present disclosure relates to power distribution systems, and more particularly to transistors in power distribution systems.

2. Description of Related Art

Power in electrical systems, such as aircraft electrical systems, is generally routed from power sources like generators and batteries of powered devices through field effect transistors (FET), e.g. metal oxide semiconductor field effect transistors (MOSFETs). Traditional FET packages, e.g. the TO-220 and TO-243, use a single large flat surface to attach to a PWB (printed wiring board) to carry current and heat in and out of the FET.

Such conventional methods and systems have generally been considered satisfactory for their intended purpose. However, there is still a need in the art for improved transistor packages. The present disclosure provides a solution for this need.

SUMMARY OF THE INVENTION

A transistor package includes a die case, a source bus tab extending from a first side of the die case, and a drain bus tab extending from a second side of the die case. The source bus tab and the drain bus tab can have the same length, the same width, and/or the same thickness. The first side and the second side of the die case can be opposite from one another.

In some embodiments, the source bus tab and/or the drain bus tab can include a first element and a second element. The first element can extend in a first direction from the die case and the second element can extend in a second direction from the first element. The second direction can be ninety degrees away from the first direction. In another embodiment, the source bus tab or the drain bus tab can include a first element, a second element and a third element. The first and second elements can be similar to those described above, and the third element can extend in a third direction from the second element. The second direction can be ninety degrees away from the first direction. The third direction can be ninety degrees away from the second direction.

It is contemplated that the transistor package can include a gate extending from a third side of the die case. The gate can include a first element and a second element. The first element of the gate can extend in a first direction from the die case and the second element of the gate can extend in a second direction from the first element. The second direction can be ninety degrees away from the first direction. In some embodiments, the gate includes a first element, a second element and a third element. The first and second elements of the gate can be similar to those described above, and the third element can extend in a third direction from the second element. The second direction can be ninety degrees away from the first direction. The third direction can be ninety degrees away from the second direction.

In accordance with another aspect, a power switch assembly includes a transistor package, similar to the transistor package described above, a first power bus rail operatively connected to the source bus tab of the transistor package and a second power bus rail operatively connected to the drain bus tab of the transistor package. The power switch assembly can include a printed wiring board (PWB) operatively connected to a gate extending from a third side of the die case.

These and other features of the systems and methods of the subject disclosure will become more readily apparent to those skilled in the art from the following detailed description of the preferred embodiments taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, embodiments thereof will be described in detail herein below with reference to certain figures, wherein.

DETAILED DESCRIPTION OF THE PREFERRED EMBODIMENTS

Figure 1A:
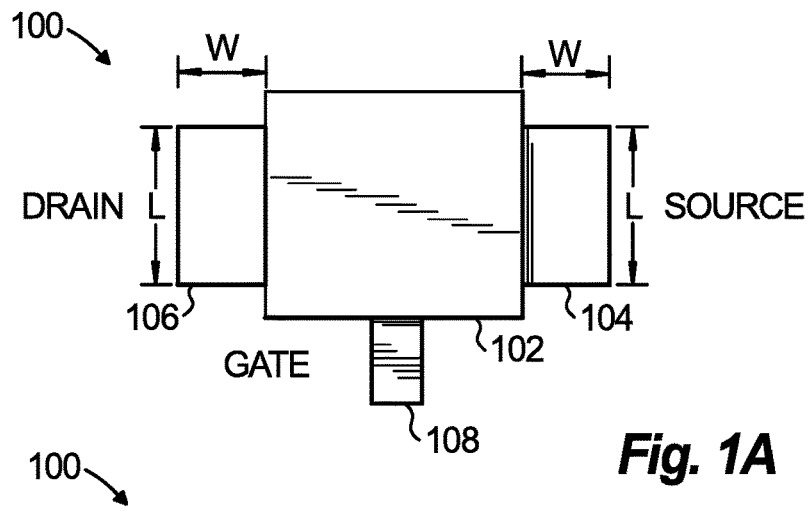
FIG. 1A is a schematic plan view of an exemplary embodiment of a transistor package constructed in accordance with the present disclosure, showing drain and source bus tabs extending from the die case.

Reference will now be made to the drawings wherein like reference numerals identify similar structural features or aspects of the subject disclosure. For purposes of explanation and illustration, and not limitation, a partial view of an exemplary embodiment of a low resistance electrical interconnect in accordance with the disclosure is shown in FIGS. 1A and 1s designated generally by reference character 100. Other embodiments of transistor packages in accordance with the disclosure, or aspects thereof, are provided in FIGS. 1A-6C, as will be described. The systems and methods described herein can be used in electrical systems, such as in aircraft power distribution systems, though the present disclosure is not limited to aircraft or to power distribution systems in general.

Figure 1B:
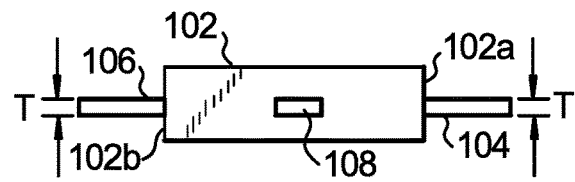
FIG. 1B is a side view of the transistor package of FIG. 1, showing a gate extending from the die case.

As shown in FIGS. 1A and 1B, a transistor package 100 includes a die case 102, a source bus tab 104 extending from a first side 102a of the die case 102, and a drain bus tab 106 extending from a second side 102b of die case 102. Source bus tab 104 and drain bus tab 106 have substantially the same length (L), the same width (W) and/or the same thickness (T). This allows current to be brought into the transistor package, e.g. a MOSFET, on the FET drain bus tab 106 (e.g. a copper bus tab) and out of the MOSFET on the FET drain bus tab 104. First side 102a and second side 102b of die case 102 are opposite from one another. Transistor package 100 includes a gate 108 extending from a third side of the die case 102. Gate 108 is connected to a PWB (not shown). Gate 108 and PWB are normal to one another, similar to the gate and PWB in FIGS. 3A-3B. Because current is brought in and out of die case 102 using bus tabs, the PWB is only used as a control interconnect for gate 108.

Figure 2A:
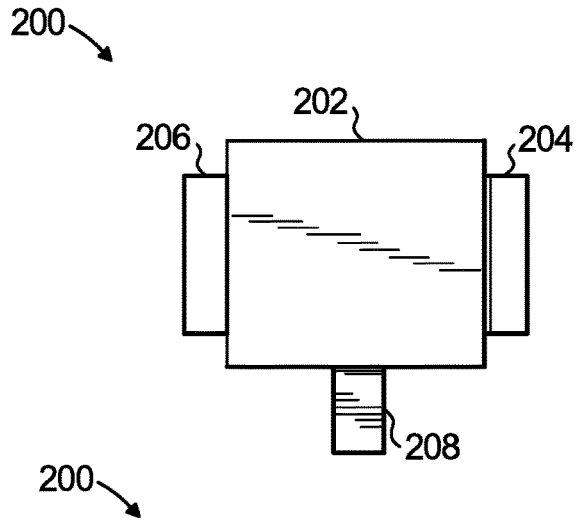
FIG. 2A is a schematic plan view of another exemplary embodiment of a transistor package constructed in accordance with the present disclosure, showing drain and source bus tabs extending from the die case.
Figure 2B:
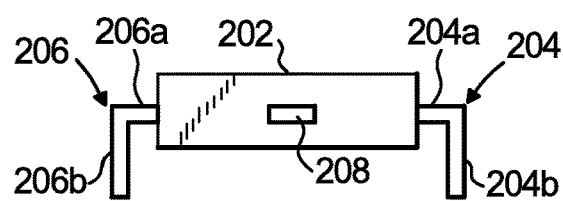
FIG. 2B is a side view of the transistor package of FIG. 2A, showing a gate extending from the die case and the elements of the drain and source bus tabs.

As shown in FIGS. 2A-2B, a transistor package 200 is similar to transistor package 100. It includes drain and source bus tabs 206 and 204, respectively, extending from a die case 202 that are similar to drain and source bus tabs 106 and 104, respectively. Drain and source bus tabs 206 and 204, however, are bent. Source bus tab 204 includes a first element 204a and a second element 204b. First element 204a extends in a first direction from the die case 202 and second element 204b extends in a second direction from first element 204a. The second direction is about ninety degrees away from the first direction. Those skilled in the art will readily appreciate that a variety of angles between the elements can be used. Drain bus tab 206 includes similar elements that extend in similar manner, e.g. a first element 206a and a second element 206b. Transistor package 200 includes a gate 208 similar to gate 108. It is contemplated that source bus tab 204 and drain bus tab 206, and the other source and drain bus tabs described below, have substantially the same length (L), the same width (W) and/or the same thickness (T).

Figure 3A:
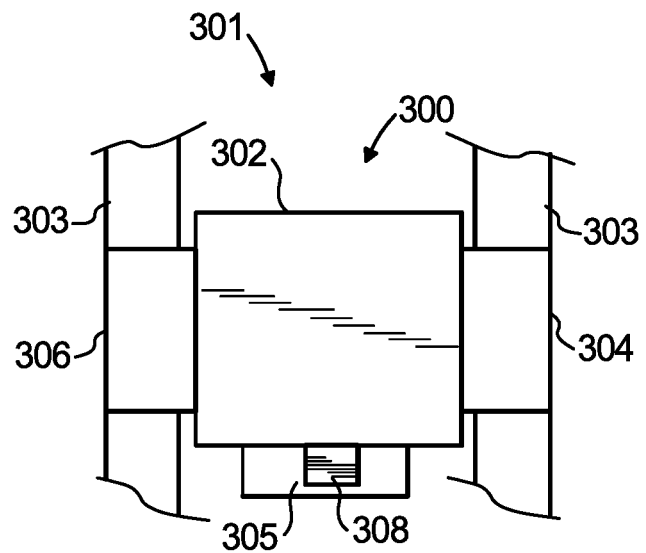
FIG. 3A is a schematic plan view of an exemplary embodiment of a power switch assembly constructed in accordance with the present disclosure, showing a transistor package operatively connected to power bus rails through drain and source bus tabs extending from the die case.
Figure 3B:
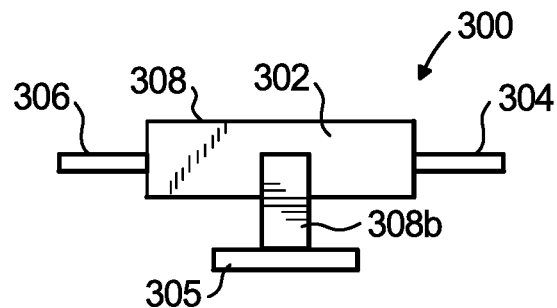
FIG. 3B is a side view of a portion of the power switch assembly of FIG. 3A, showing the gate extending from the die case of the transistor package and connecting to the PWB.
Figure 3C:
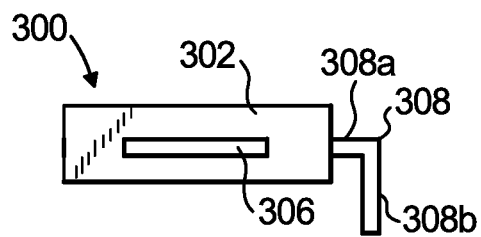
FIG. 3C is a side view of the transistor package of FIG. 3A, showing the elements of the gate.

As shown in FIG. 3A, a power switch assembly 301 includes a transistor package 300 operatively connected to first and second power bus bar rails 303 through drain and source bus tabs 306 and 304, respectively, extending from a die case 302 of package 300. Transistor package 300 is similar to transistor package 100. Transistor package 300 includes a gate 308 similar to gate 108. Gate 308, however, is bent. As shown in FIGS. 3B-3C, gate 308 includes a first element 308a and a second element 308b. First element 308a extends in a first direction from die case 302 and second element 308b extends in a second direction from first element 308a. The second direction is about ninety degrees away from the first direction. Power switch 301 includes a printed wiring board (PWB) 305 operatively connected to gate 308 extending from a third side of the die case 302. Gate 308 connects to PWB 305 and is normal to PWB 305. The other gates described herein can also connect to a PWB. Similarly, the other drain and source bus tabs can also be connected to bus bar rails. The positioning and shape of the bus bar rails and PWB will vary depending on the package configuration.

Figure 4A:
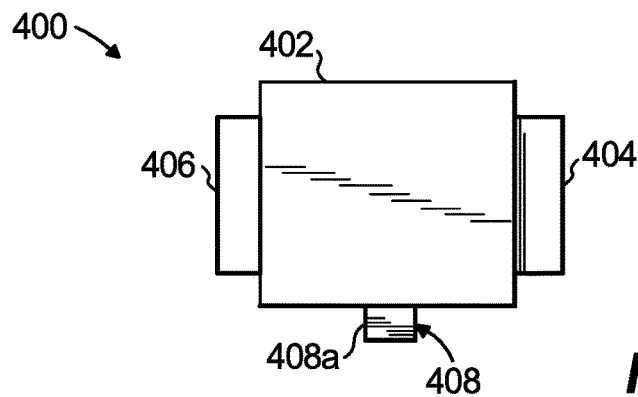
FIG. 4A is a schematic plan view of another exemplary embodiment of a transistor package constructed in accordance with the present disclosure, showing drain and source bus tabs and the gate extending from the die case.
Figure 4B:
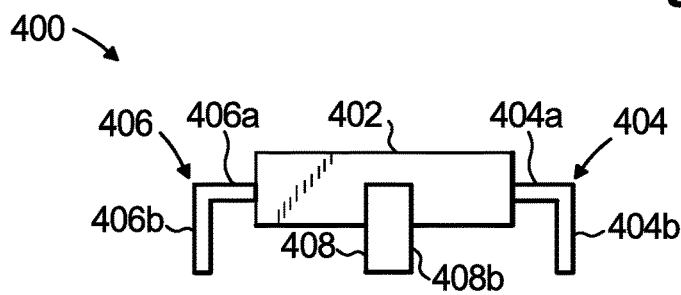
FIG. 4B is a side view of the transistor package of FIG. 4A, showing the elements of the drain and source bus tabs.

With reference now to FIGS. 4A-4B, a transistor package 400 is similar to transistor package 100, except that drain and source bus tabs, 406 and 404, respectively, and gate 408 are all bent. Drain and source bus tabs 406 and 404, respectively, extend from a die case 402. Drain and source bus tabs 406 and 404, however, are bent, similar to drain and source bus tabs 206 and 204. Source bus tab 404 includes a first element 404a and a second element 404b. First element 404a extends in a first direction from die case 404 and second element 404b extends in a second direction from first element 404a. The second direction is about ninety degrees away from the first direction. Drain bus tab 406 includes similar elements that extend in similar manner, e.g. a first element 406a and a second element 406b. Transistor package 400 includes a gate 408 similar to gate 308. Gate 408 has a first element 408a and a second element 408b. First element 408a extends in a first direction and second element 408b extends in a second. The second direction is about ninety degrees away from the first direction. Those skilled in the art will readily appreciate that a variety of angles between the elements can be used.

Figure 5A:
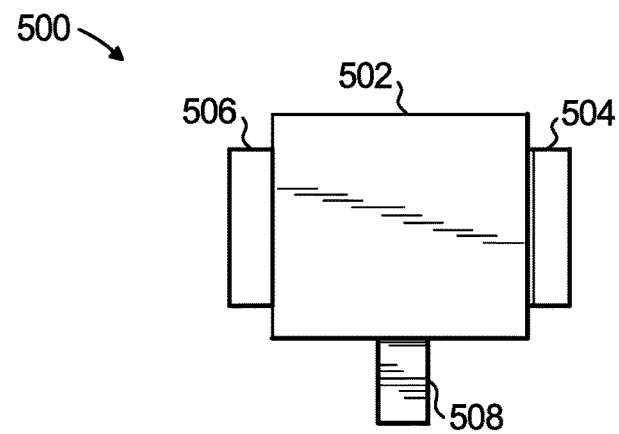
FIG. 5A is a schematic plan view of another exemplary embodiment of a transistor package constructed in accordance with the present disclosure, showing drain and source bus tabs extending from the die case.
Figure 5B:
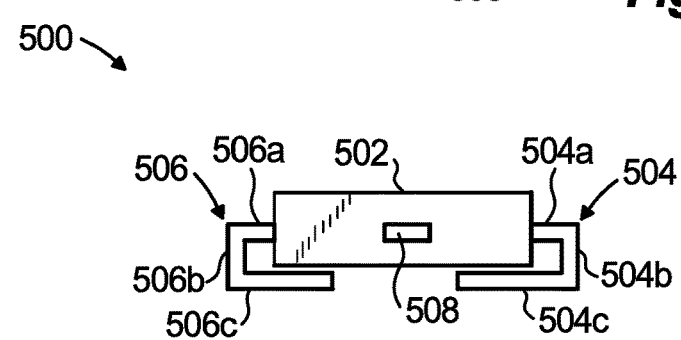
FIG. 5B is side view of the transistor package of FIG. 5A, showing a gate extending from the die case and the elements of the drain and source bus tabs.

As shown in FIGS. 5A-5B, a transistor package 500 is similar to transistor package 100. It includes drain and source bus tabs 506 and 504, respectively, extending from a die case 502 that are similar to drain and source bus tabs 106 and 104, respectively. Drain and source bus tabs 506 and 504, however, are bent. Source bus tab 504 includes a first element 504a, a second element 504b and a third element 504c. First element 504a extends in a first direction from the die case 502 and second element 504b extends in a second direction from first element 504a. The second direction is about ninety degrees away from the first direction. The third element 504c extends in a third direction away from second element 504b. The third direction is about ninety degrees away from the second direction. Those skilled in the art will readily appreciate that a variety of angles between the elements can be used. Drain bus tab 506 includes similar elements that extend in similar manner, e.g. a first element 506a, a second element 506b and a third element 506c. Transistor package 500 includes a gate 508 similar to gate 108.

Figure 6A:
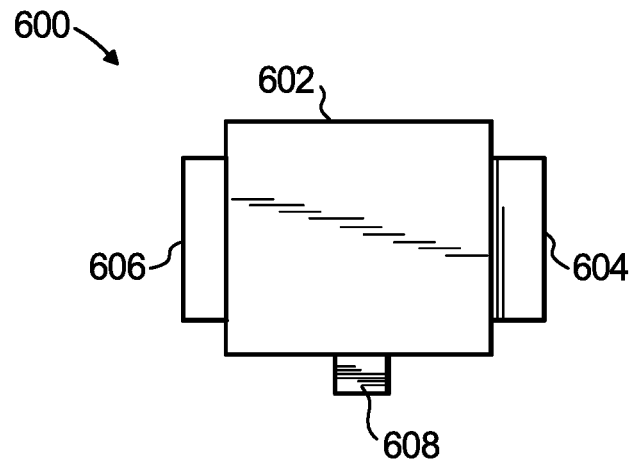
FIG. 6A is a schematic plan view of another exemplary embodiment of a transistor package constructed in accordance with the present disclosure, showing drain and source bus tabs extending from the die case.
Figure 6B:
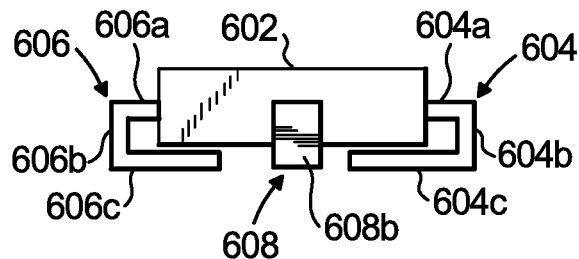
FIG. 6B is side view of the transistor package of FIG. 6A, showing a gate extending from the die case and showing the elements of the drain and source bus tabs.
Figure 6C:
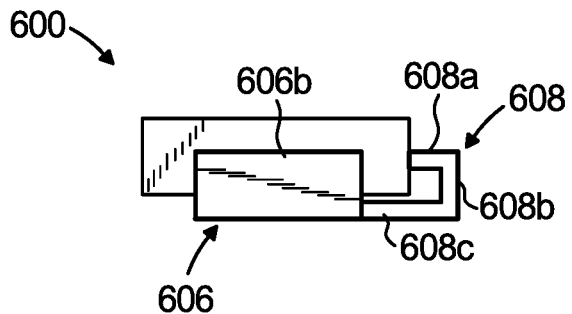
FIG. 6C is side view of the transistor package of FIG. 6A, showing the elements of the gate.

As shown in FIGS. 6A-6C, a transistor package 600 is similar to transistor package 100. It includes drain and source bus tabs 606 and 604, respectively, extending from a die case 602 that are similar to drain and source bus tabs 106 and 104, respectively. Drain and source bus tabs 606 and 604, however, are bent. Source bus tab 604 includes a first element 604a, a second element 604b and a third element 604c. First element 604a extends in a first direction from the die case 602 and second element 604b extends in a second direction from first element 604a. Third element 604c extends in a third direction from the second element 604b. The second direction is about ninety degrees away from the first direction. The third direction is about ninety degrees away from the second direction. Those skilled in the art will readily appreciate that a variety of angles between the elements can be used. Drain bus tab 606 includes similar elements that extend in similar manner, e.g. a first element 606a, a second element 606b and a third element 606c.

With continued reference to FIGS. 6A and 6B, transistor package 600 includes a gate 608 similar to gate 108. Gate 608, however, is bent in a manner similar to drain and source bus tabs 606 and 604, respectively. Gate 608 includes a first element 608a, a second element 608b and a third element 608c. First element 608a extends in a first direction from the die case 602 and second element 608b extends in a second direction from first element 608a. Third element 608c extends in a third direction from the second element 608b. The second direction is about ninety degrees away from the first direction. The third direction is about ninety degrees away from the second direction.

Embodiments of this invention allows both the input and output current to flow on high capacity bus tabs and minimizes the need for thick layers, e.g. layers of copper, on the PWB. This tends to provide advantages over traditional packages that have a single large flat surface to attach to a PWB for carrying current and heat, as, generally, the thicknesses available for conductive layer (e.g. copper) on a traditional PWB is much less than the thickness available in a bus tab. The increased thickness potential means that embodiments of the present invention can handle higher current and provide better heat dissipation.

The methods and systems of the present disclosure, as described above and shown in the drawings provide for transistors with superior properties including increased capacity and increased heat dissipation. While the apparatus and methods of the subject disclosure have been shown and described with reference to preferred embodiments, those skilled in the art will readily appreciate that change and/or modifications may be made thereto without departing from the scope of the subject disclosure.

What is claimed is:

1. A transistor package comprising:
   a die case having a top surface and a bottom surface opposite from the top surface;
   a source bus tab extending from a first side of the die case, wherein a portion of the source bus tab that extends from the first side is spaced apart from the top surface and the bottom surface in a direction perpendicular to the top surface;
   a drain bus tab extending from a second side of the die case opposite from the first side, wherein a portion of the drain bus tab that extends from the second side is spaced apart from the top surface and the bottom surface in the direction perpendicular to the top surface; and
   a gate extending from a third side of the die case, wherein the gate includes a first element and a second element, wherein the first element of the gate extends in a first direction from the die case and the second element of the gate extends in a second direction from the first element, wherein the third side of the die case is perpendicular to both the first side of the die case and the second side of the die case, wherein a portion of the gate that extends from the third side is spaced apart from the top surface and the bottom surface in the direction perpendicular to the top surface, and wherein the portions of the source bus tab and the drain bus tab that extend from the die case are spaced apart from an exterior surface of the third side in a direction perpendicular to the exterior surface of the third side.

2. The transistor package as recited in claim 1, wherein the source bus tab and the drain bus tab have at least one of the same length, the same width or the same thickness.

3. The transistor package as recited in claim 1, wherein at least one of the source bus tab or the drain bus tab include a first element and a second element.

4. The transistor package as recited in claim 3, wherein the first element extends in a first direction from the die case and the second element extends in a second direction from the first element.

5. The transistor package as recited in claim 4, wherein the second direction is ninety degrees away from the first direction.

6. The transistor package as recited in claim 1, wherein at least one of the source bus tab or the drain bus tab include a first element, a second element and a third element.

7. The transistor package as recited in claim 6, wherein the first element extends in a first direction from the die case, the second element extends in a second direction from the first element, and the third element extends in a third direction from the second element.

8. The transistor package as recited in claim 7, wherein the second direction is ninety degrees away from the first direction.

9. The transistor package as recited in claim 7, wherein the third direction is ninety degrees away from the second direction.

10. The transistor package as recited in claim 1, wherein the second direction is ninety degrees away from the first direction.

11. The transistor package as recited in claim 1, wherein the gate includes a third element.

12. The transistor package as recited in claim 11, wherein the third element of the gate extends in a third direction from the second element.

13. The transistor package as recited in claim 12, wherein the second direction is ninety degrees away from the first direction.

14. The transistor package as recited in claim 13, wherein the third direction is ninety degrees away from the second direction.

15. A power switch assembly comprising:
    a transistor package including:
        a die case having a top surface and a bottom surface opposite from the top surface;
        a source bus tab extending from a first side of the die case, wherein a portion of the source bus tab that extends from the first side is spaced apart from the top surface and the bottom surface in a direction perpendicular to the top surface;
        a drain bus tab extending from a second side of the die case opposite from the first side, wherein a portion of the drain bus tab that extends from the second side is spaced apart from the top surface and the bottom surface in the direction perpendicular to the top surface; and
        a gate extending from a third side of the die case, wherein the gate includes a first element and a second element, wherein the first element of the gate extends in a first direction from the die case and the second element of the gate extends in a second direction from the first element, wherein the third side of the die case is perpendicular to both the first side of the die case and the second side of the die case, wherein a portion of the gate that extends from the third side is spaced apart from the top surface and the bottom surface in the direction perpendicular to the top surface, and wherein the portions of the source bus tab and the drain bus tab that extend from the die case are spaced apart from an exterior surface of the third side in a direction perpendicular to the exterior surface of the third side;
    a first power bus bar rail operatively connected to the source bus tab of the transistor package; and
    a second power bus bar rail operatively connected to the drain bus tab of the transistor package.

16. The power switch assembly as recited in claim 15, further comprising a printed wiring board (PWB) operatively connected to the gate extending from the third side of the die case.

17. The power switch assembly as recited in claim 15, wherein the first and second power bus bar rails are parallel to one another.

18. The power switch assembly as recited in claim 15, wherein the second direction is ninety degrees away from the first direction.

19. The power switch assembly as recited in claim 15, wherein the gate includes a third element.

20. The power switch assembly as recited in claim 19, wherein the third element of the gate extends in a third direction from the second element.

* * * * *